(12) United States Patent
Bluck et al.

(10) Patent No.: US 8,087,380 B2
(45) Date of Patent: Jan. 3, 2012

(54) EVAPORATIVE SYSTEM FOR SOLAR CELL FABRICATION

(75) Inventors: Terry Bluck, Santa Clara, CA (US); Michael S. Barnes, San Ramon, CA (US); Kevin P. Fairbairn, Los Gatos, CA (US)

(73) Assignee: Intevac, Inc., Santa Clara, CA (US)

( * ) Notice: Subject to any disclaimer, the term of this patent is extended or adjusted under 35 U.S.C. 154(b) by 0 days.

(21) Appl. No.: 12/610,187

(22) Filed: Oct. 30, 2009
(Under 37 CFR 1.47)

(65) Prior Publication Data

US 2011/0104847 A1   May 5, 2011

(51) Int. Cl.
*C23C 14/34* (2006.01)
(52) U.S. Cl. .................. 118/723 VE; 438/679; 438/908
(58) Field of Classification Search ............ 118/723 VE; 438/679, 908
See application file for complete search history.

(56) References Cited

U.S. PATENT DOCUMENTS

| | | | |
|---|---|---|---|
| 4,325,986 A | 4/1982 | Baron et al. | |
| 5,844,195 A | 12/1998 | Fairbairn et al. | |
| 6,537,845 B1 | 3/2003 | McCandless et al. | |
| 7,001,831 B2 | 2/2006 | Niira et al. | |
| 7,194,197 B1 | 3/2007 | Wendt et al. | |
| 2007/0193519 A1 | 8/2007 | Benvenuti et al. | |
| 2008/0248647 A1 | 10/2008 | Morad | |
| 2009/0078374 A1 | 3/2009 | Bluck et al. | |
| 2010/0024731 A1* | 2/2010 | Eristoff et al. | 118/723 VE |

OTHER PUBLICATIONS

R.N. Sacks, et al., "Promising new valved source for Ga or In evaporation," Journal of Vacuum Science and Technology B, May/Jun. 2007, pp. 983-986, vol. 25, Issue No. 3, American Vacuum Society.
F. Geiger, et al., "The vapor pressure of indium, silver, gallium, copper, tin, and gold between 0.1 and 3.0 bar," International Journal of Thermophysics, Jul. 1987, pp. 425-436, vol. 8, No. 4, Springer Netherlands.

* cited by examiner

*Primary Examiner* — Mary Wilczewski
*Assistant Examiner* — Toniae Thomas
(74) *Attorney, Agent, or Firm* — Nixon Peabody LLP; Joseph Bach, Esq.

(57) ABSTRACT

A plurality of chamber are arranged about a transport chamber. The linear transport chamber may include a linear track supporting robot arms. The robot arms transport substrates to and from the chambers. Each chamber includes a plurality of evaporators, each controlled independently. Each substrate positioned in the chamber is coated from a plurality of the evaporators, such that by controlling the operation of each evaporator independently the formation of the layers and the concentration gradient of each layer can be precisely controlled.

14 Claims, 4 Drawing Sheets

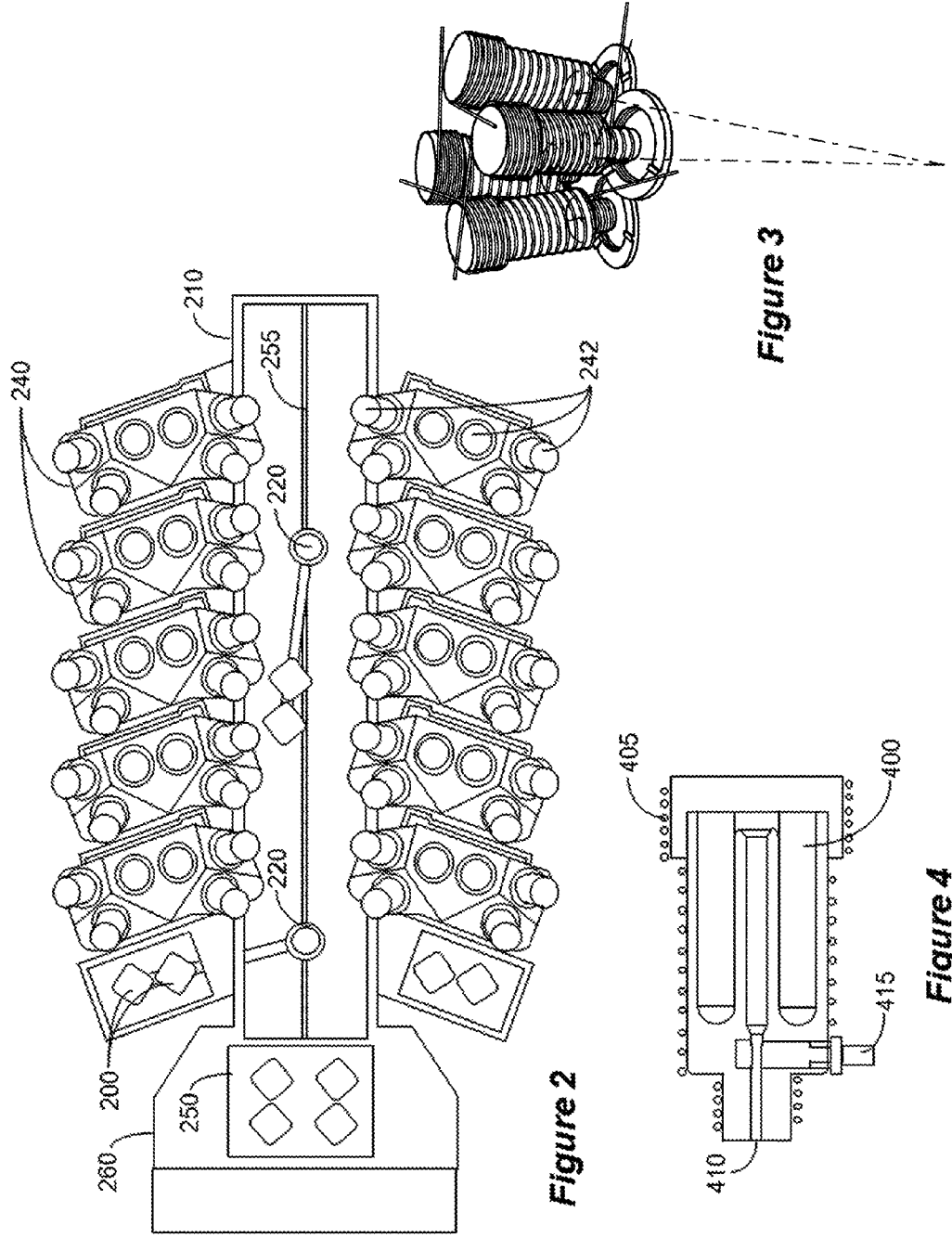

US 8,087,380 B2

EVAPORATIVE SYSTEM FOR SOLAR CELL FABRICATION

BACKGROUND

1. Field

The subject invention relates to processing of substrates and, more specifically, for systems for forming thin films over substrates to produce devices, such as solar cells.

2. Related Art

Vacuum processing systems are used to fabricate hard-drive disks, semiconductor computer chips, solar panels, and the like, from substrates made of materials such as semiconductor wafers, glass, stainless steel, etc. Typically, the vacuum processing systems include several substrate chambers that perform various processes that modify the substrate by performing deposition, cleaning, etching, heating/cooling, etc., on the substrate. Deposition of films is generally accomplished using, e.g., physical vapor deposition (PVD) or chemical vapor deposition (CVD). PVD can be performed using, e.g., sputtering or evaporation systems. Sputtering process can be controlled relatively well and thin films formed using sputtering sources can be of high quality and uniformity. However, sputtering sources are relatively expensive and target utilization is relatively low. On the other hand, evaporation systems are relatively of low cost and high utilization, albeit using current technology they are more difficult to control to form films of precise thickness and uniformity.

Fabrication of solar cells is a recent emerging field which utilizes thin film technologies. There are several basic forms of solar cells, including c-Si, a-Si:H, n-Si:H, CIS/CIGS/CIGS-S, CdTe, GaAs and Organic or Dye Sensitized devices. There are many layer combinations that comprise modern cells, many of which may be fabricated using thin film fabrication techniques. For example, absorber layers, low resistivity rear electrodes, high resistivity intermediate or buffer layers and high optical transmission moderate resistivity window layers are essential components in the fabrication of solar cells. In order to tailor such layers to achieve requisite results on specified figures of merit, such as Voc, Isc, Fill Factor, conversion efficiency and numerous other parameters, precise atomic concentrations of materials must be deposited.

FIG. 1 illustrates schematically an evaporation system of the prior art. A feed roll provides a sheet of flexible substrate, which is collected by the end roll. As the substrate rolls, it passes over a series of evaporators. The evaporators inject the material to be deposited onto the substrate, in the proper sequence for generating the proper sequence of layers.

One problem with such systems is that it is impossible to stop deposition of a material part of the way through depositing a layer. Also, it is difficult to control the temperature uniformity, film uniformity, and reaction uniformity on such large webs. The use of webs causes the systems to be very large, such that it impacts the scale up, which is limited to large step function changes. Furthermore, when any part of the system is down, the entire system must be stopped, causing a large drop in output. Furthermore, the large substrates inherently desorbs significant amount of water, which effects the cell efficiency. Degas is also very difficult with web processing. Also, it is difficult to co-deposit material from different conventional large evaporators.

In addition to controlling the formation of the various layers, in various solar cell structures, such as in CIGS, the material concentration in each layer may have a controlled gradient. Precise control of each such gradient can help in achieving a higher conversion efficiency of the fabricated cell. However, using roll to roll technology it is impossible to generate gradients in the various layers. The National Renewable Energy Laboratory (NREL) has published on its website its equipment used for CIGS research. The diagram published on the NREL website is shown in FIG. 1A and is described on NREL's website as: "Copper Indium Gallium Diselenide cluster tool indicating the functions of its eight ports."

SUMMARY

The following summary of the invention is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

The subject invention aims to solve the problems present in the prior art. Embodiment of the subject invention utilize novel deposition system to produce precise layers with precisely controlled concentration gradients and at very high throughput. Systems made according to embodiments of the invention can be beneficially utilized to form thin films, for example, bi- or multi-layer, films of single or several nanometer-thick, which can be utilized for formation of, e.g., enhanced absorber and window layers of solar cells.

According to aspects of the invention, a plurality of chamber are arranged about a linear transport chamber. The linear transport chamber includes a linear track supporting robot arms. The robot arms transport substrates to and from the chambers. Each chamber includes a plurality of evaporators, each controlled independently. Each substrate positioned in the chamber is coated from a plurality of the evaporators, such that by controlling the operation of each evaporator independently the formation of the layers and the concentration gradient of each layer can be precisely controlled.

According to an aspect of the invention, a substrate processing system is disclosed, comprising: a front end module transporting cassettes holding substrates therein; a loadlock module coupled to the front end module and having mechanism for loading substrates from the cassettes onto the loadlock; a transport chamber coupled to the loadlock and having a linear track; transport robot arms riding on the linear track; and, a plurality of processing chambers coupled to the transport chamber, each having a plurality of substrate supports and a plurality of evaporators, the evaporators of each chamber divided into subgroup, each subgroup being configured to deposit materials onto one substrate.

According to an aspect of the invention, a method for fabricating solar cells is provided, comprising: transporting a substrate from an atmospheric environment into a vacuum environment; transporting the substrate from the vacuum environment into a processing chamber having a plurality of evaporators, and placing the substrate onto a substrate support; heating the substrate; charging each of the evaporators with materials to be evaporated; evaporating the material within each evaporator; and, controlling deposition onto the substrate from each evaporator.

BRIEF DESCRIPTION OF THE DRAWINGS

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

FIG. 1 illustrates an evaporation system according to the prior art, while

FIG. 2 is a simplified schematic illustrating an evaporation system according to an embodiment of the invention;

FIG. 3 illustrates an embodiment wherein four individual evaporators are positioned so as to deposit on a single substrate;

FIG. 4 is a simplified cross-section schematic of an evaporator according to an embodiment of the invention;

DETAILED DESCRIPTION

Figure 1:
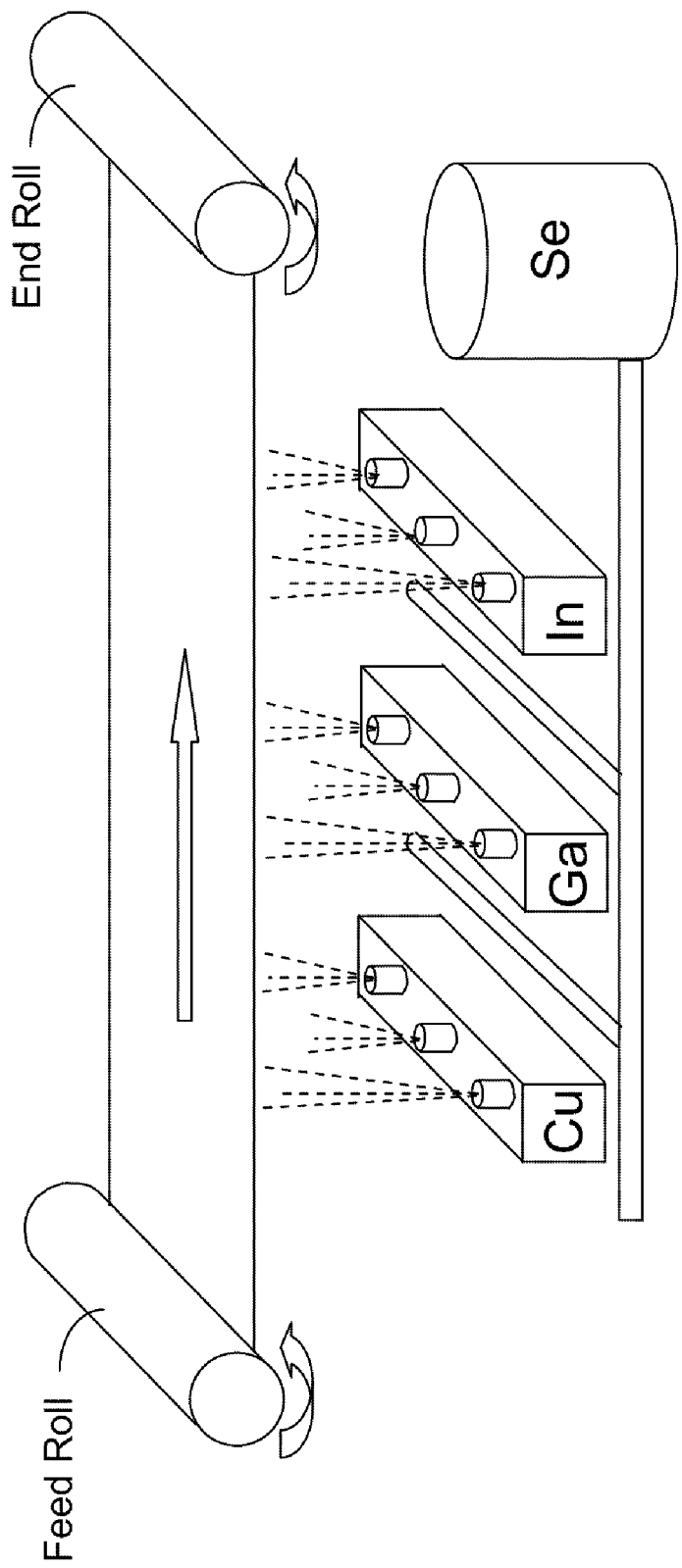
Figure 1A:
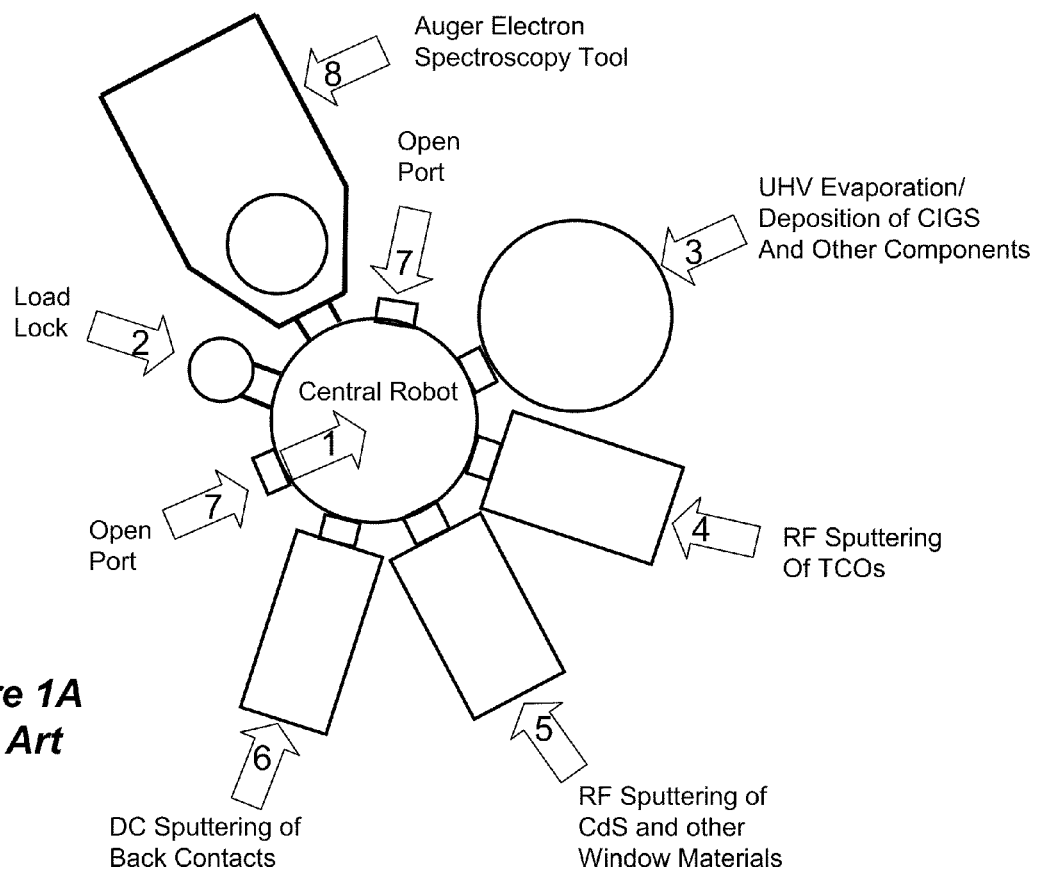
FIG. 1A is a schematic of a system published on NREL's website.

A detailed description will now be given of solar cells processing system according to embodiments of the invention. FIG. 2 illustrates a system for high capacity processing of substrates, which employs unique evaporation chambers coupled to main frame transport chamber. The system can be used for solar cells production and provides highly controlled deposition in a clean environment. The system is generally constructed of several identical processing chambers 240 connected to a transport chamber 210. During processing each of chambers 240 can be vacuum isolated from the transport chamber 210. The two left-most chambers in FIG. 2 are illustrated with the top removed, so that the interior of the chambers can be seen for better understanding of the invention. As shown in open chambers of FIG. 2, in this particular embodiment, each chamber 240 processes two substrates 200 simultaneously. Robot arms 252 ride on a linear track 225, each capable of carrying two substrates simultaneously.

A front end module 260 is utilized to load and remove substrates into/from loadlock 250, such that the substrates can be introduced into the vacuum clean environment of the processing system. The front end unit 260 also maintains therein a clean, but atmospheric environment. The robotic arms 220 can independently travel so as to remove substrates 200, two at a time, from the loadlock 250 and transfer them into one of the evaporation chambers 240. The robotic arms 220 can also independently travel so as to move substrates 200, two at a time, from one of the evaporation chambers 240 to another, or from an evaporation chamber 240 back into the loadlock 250 when processing is completed. In the embodiment of FIG. 2, each of the processing chambers 240 can be provided with identical composition of material to be evaporated, such that all of the chambers perform the exact process. Under such an arrangement, each substrate is moved from the loadlock 250 into one of the chambers 240, is processed therein, and then removed back to the loadlock 250. On the other hand, some chambers 240 may be loaded with different composition, such that each substrate is processed in more than one process chamber, according to a predetermined sequence, prior to being removed back to the loadlock.

As shown in FIG. 2, each of the processing chambers 240 includes a plurality of evaporators 242. The plurality of evaporators of each chamber is divided into two groups, each group of evaporators is directed to deposit layers on a single substrate. In FIG. 2, each group consists of three evaporators aimed at the same substrate. FIG. 3 illustrates an embodiment wherein four individual evaporators 342 are positioned so as to deposit on a single substrate. The four evaporators may be charged with the same or different materials to be evaporated, e.g., elemental Se, Cu, Ga, In, which are evaporated by heating them to high temperatures. Also, each individual evaporator is operable independently and, as will be explained below, can be activated to deposit at different times and/or different rates, such that they can be activated to deposit all simultaneously or in any combination, e.g., first deposit from two evaporators then switch to the other two evaporators, deposit from each evaporator individually in sequence, etc. In one example, one evaporator is utilized for each of Cu, Ga, In, and Se evaporation material. In one example, during processing, first the Copper evaporator is activated, then the selenium, then the gallium, then the selenium, and then the indium, to thereby deposit a CIGS layer in one single chamber. Moreover, since each evaporator can be activated independently, and since all evaporators in the group point to the same substrate, this embodiment enables depositing layers with precise control of gradients of deposited material. For example, the first evaporator can be fully activated for depositing copper, then as the selenium evaporator is being slowly opened and its deposition increased, the copper evaporator is slowly closed, such that the cupper layer is deposited with decreased concentration of copper rather than ending abruptly.

Figure 5A:
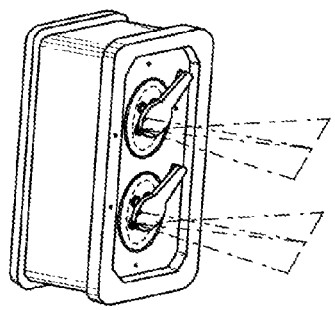
FIGS. 5A-5C illustrate evaporation head according to an embodiment of the invention.
Figure 5B:
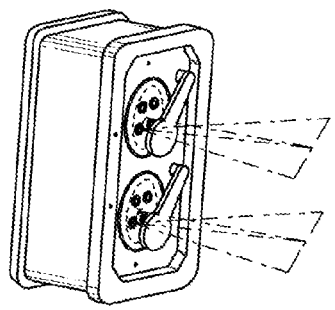
Figure 5C:
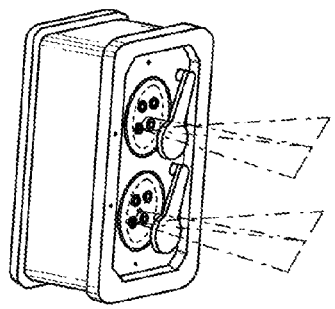

The control mechanisms for the activation as described above can be done using three different separate mechanisms as follows. The first control is the temperature of the evaporator: this is set to get the desired rate out of the nozzle of the evaporator and is material dependent. For example, for copper it would be at about 1500 C, Indium at about 1000 C, Gallium at about 1200 C, etc. Due to the high thermal mass, this control should not be adjusted during process, as it may take hours to reach thermal stability. The second control is a valve on the evaporator, as shown in FIG. 4: this valve can be moved from fully open to fully closed and changes the rate of material leaving the nozzle from the maximum determined by temperature, surface area of the melt, and nozzle size. The third control is a shutter as shown in FIGS. 5A-5C: the shutter blocks the material coming from the evaporator(s). The material is still coming out from the evaporators, but it condenses on the shutter. When the position of the valve is changed from off to on, there can be pressure spikes that cause the material to come out at a much higher rate. This can be addressed by using the shutter in conjunction with the valve. The shutter can be used with a valve to prevent pressure spikes and to reduce the wasted material. The shutter can block none, one, more or all of the nozzles. To prevent pressure spike problems the shutter is closed when the valve is opened and the shutter opens shortly after the valve is opened.

FIG. 4 is a simplified cross-section schematic of a single evaporator according to an embodiment of the invention. Each evaporator includes a crucible 400 containing the liquid to be evaporated, heater 405, e.g., resistive heater, injector 410, and valve 415. The valve 415 can be used to control the amount of deposition material or to completely shut off deposition. In this embodiment the valve 415 is embedded in the crucible body, so that its temperature is the same as that of the crucible, thereby avoiding condensation on the valve and adverse temperature effects on the deposition stream. At the temperatures in which the evaporator operates the valve should be made of refractory materials, but may still have high wear. To address this problem the valve is made from a sleeve and rod. When the sleeve and/or rod wear, they can be replaced without replacing the expensive crucible.

FIGS. 5A-5C illustrate an evaporation head 500 according to an embodiment of the invention. In this embodiment, evaporation head 500 houses four evaporators, such as the evaporators shown in FIG. 3. The evaporation head 500 is mounted onto an opening on the top of a process chamber, such as the process chambers shown in FIG. 2. As can be seen in FIGS. 5A-5C, the bottom of the evaporation head 500 has two groups of four openings, one opening per one evaporator. In this manner, the camber can process two substrates simultaneously. That is, each group of four evaporators is positioned so as to deposit onto one substrate via the four openings. Also shown in FIGS. 5A-5C is optional shutters 550. In FIG. 5A the shutters 550 completely cover all four openings, such that deposition from all eight evaporators is completely prevented. In FIG. 5B three openings of each group are exposed, while one opening is shuttered, such that deposition can only be performed from the three exposed openings, but not from the shuttered opening. In FIG. 5C all openings are exposed such that deposition can be performed from any evaporator. Of course, other arrangements of shutters can be utilized, e.g., one individual shutter for each opening, or one shutter per two openings, etc.

Figure 6:
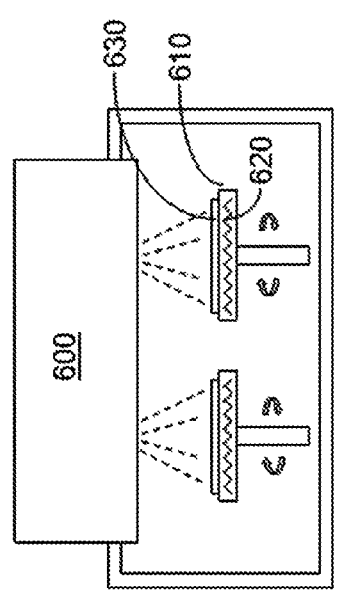
FIG. 6 is a simplified cross section of a processing chamber according to an embodiment of the invention.

FIG. 6 is a simplified cross section of a processing chamber according to an embodiment of the invention. The chamber has two substrate holders 610 for supporting substrates 630. Each holder may incorporate a heater 620 and may optionally be rotatable for increased deposition uniformity. A deposition head 600, such as that shown in FIGS. 5A-5C is provided on top of the chambers, such that each group of evaporators deposit onto one substrate.

Figure 7:
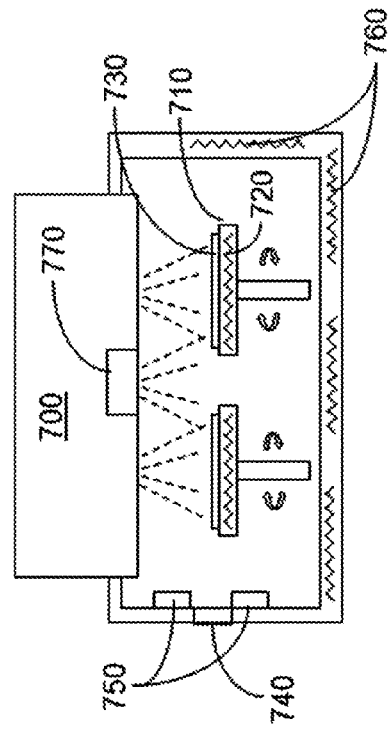
FIG. 7 illustrates another embodiment of the processing chamber according to the invention.

FIG. 7 illustrates another embodiment of the processing chamber according to the invention. In the embodiment of FIG. 7, a single source 770 provides selenium for deposition on both substrates. In this embodiment, the source 770 could be, for example, an external selenium source with a tube running through the vacuum wall or top cover. The selenium is delivered with an over pressure so that there is always enough selenium in the chamber for the reaction that occurs at the substrates' surface. The selenium only stays at the substrate as part of the reaction. Any un-reacted selenium will not stick to the substrate. The selenium source could also be a single evaporator source located above the two substrates such that it supplies an over pressure of selenium to both substrates. There needs to be more than enough selenium to react but it is not that important whether the pressure is much higher than necessary for deposition.

In the embodiment of FIG. 7, heat and cooled chamber shields and fillers can be used to control where the excess selenium deposits and to minimize wasted selenium. For example, cold traps 750 could be used near openings, such as load lock 740, to prevent selenium from passing through these openings. Similarly, heaters 760 can be provided to keep the walls hot so as to keep the selenium in the chamber and available for reaction, rather than sticking to the walls.

Advantages of the disclosed system include: production capacity can be increased in small steps as demand grows; graduated or step function films can be created because the substrate is stationary and not scanned by the deposition sources and the evaporators are controlled individually with valves and/or shutters; deposition uniformity is easier to control since the evaporators are relatively small and have individual nozzles; heating uniformity can be achieved since the substrates are small and stationary and are seated on the heater or very close to it; the processing chambers are relatively small, so the reduced surface area can be preheated to desorb water prior to processing and the substrates can also be degassed prior to introducing them into the processing system.

It should be understood that processes and techniques described herein are not inherently related to any particular apparatus and may be implemented by any suitable combination of components. Further, various types of general purpose devices may be used in accordance with the teachings described herein. The present invention has been described in relation to particular examples, which are intended in all respects to be illustrative rather than restrictive. Those skilled in the art will appreciate that many different combinations will be suitable for practicing the present invention.

The present invention has been described in relation to particular examples, which are intended in all respects to be illustrative rather than restrictive. Those skilled in the art will appreciate that many different combinations of will be suitable for practicing the present invention. Moreover, other implementations of the invention will be apparent to those skilled in the art from consideration of the specification and practice of the invention disclosed herein. Various aspects and/or components of the described embodiments may be used singly or in any combination. It is intended that the specification and examples be considered as exemplary only, with a true scope and spirit of the invention being indicated by the following claims.

What is claimed is:

1. A substrate processing system for fabricating solar cells, comprising:
    a front end module transporting cassettes holding substrates therein;
    a loadlock module coupled to the front end module and having mechanism for loading substrates from the cassettes onto the loadlock;
    a transport chamber; and,
    a plurality of processing chambers coupled to the transport chamber, each having a plurality of substrate supports and a plurality of evaporators, the evaporators of each chamber divided into subgroup, each subgroup being configured to deposit materials onto one substrate.

2. The substrate processing system of claim 1, wherein the transport chamber comprises a linear track and transport robot arms riding on the linear track.

3. The substrate processing system of claim 1, wherein deposition from each evaporator is configured to be controlled independently of other evaporators.

4. The substrate processing system of claim 1, wherein each of substrate supports comprises a substrate heater.

5. The substrate processing system of claim 1, wherein each processing chamber comprises a plurality of substrate supports.

6. The substrate processing system of claim 5, wherein each substrate support is positioned so as to receive deposition from a set of four evaporator sources comprising at least one evaporator to deposit copper, at least one evaporator to deposit gallium, at least one evaporator to deposit indium and at least one evaporator to deposit a selenium.

7. The substrate processing system of claim 5, wherein each substrate support is directly opposed by one or more uniformly spaced sets of four evaporator sources, wherein each set is comprised of one evaporator to deposit copper, one evaporator to deposit gallium, one evaporator to deposit indium and one evaporator deposit selenium.

8. The substrate processing system of claim 1, wherein each of the evaporators comprises a crucible within a main body, a heater provided about the main body, an injection opening, and a control valve in thermal contact with the main body.

9. The substrate processing system of claim 1, wherein each of the chambers comprises an evaporation head housing the evaporators, wherein the evaporator head further comprises shutters for controlling evaporation material reaching the substrates.

10. The substrate processing system of claim 1, wherein each of the substrate supports is rotatable.

11. The substrate processing chamber of claim 1, wherein each of the processing chambers is provided with the same material composition.

12. The substrate processing system of claim 9, wherein each of the evaporators comprises a valve adjustable for controlling the amount of evaporated material leaving the evaporator.

13. The substrate processing system of claim 1, wherein each of the evaporators comprises a valve adjustable for controlling the amount of evaporated material leaving the evaporator.

14. The substrate processing system of claim 13, wherein each of the chambers further comprises shutters adjustable for controlling evaporated material reaching the substrate.

\* \* \* \* \*